(12) United States Patent
Yamazaki et al.

(10) Patent No.: US 7,315,035 B2
(45) Date of Patent: Jan. 1, 2008

(54) APPARATUS AND METHOD FOR DOPING

(75) Inventors: Shunpei Yamazaki, Tokyo (JP); Toshiji Hamatani, Kanagawa (JP); Koichiro Tanaka, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 277 days.

(21) Appl. No.: 11/221,956

(22) Filed: Sep. 9, 2005

(65) Prior Publication Data

US 2006/0006348 A1    Jan. 12, 2006

Related U.S. Application Data

(63) Continuation of application No. 09/235,143, filed on Jan. 21, 1999, now Pat. No. 7,118,996, which is a continuation of application No. 08/855,818, filed on May 12, 1997, now Pat. No. 5,892,235.

(30) Foreign Application Priority Data

May 15, 1996   (JP)   ................................. 8-146634
Oct. 3, 1996   (JP)   ................................. 8-281874

(51) Int. Cl.
    *H01J 37/317*    (2006.01)
(52) U.S. Cl. .................. 250/492.21; 250/398
(58) Field of Classification Search .......... 250/492.21, 250/398, 396 R, 423 R
    See application file for complete search history.

(56) References Cited

U.S. PATENT DOCUMENTS

| | | |
|---|---|---|
| 4,276,477 A | 6/1981 | Enge |
| 4,578,589 A | 3/1986 | Aitken |
| 4,804,852 A | 2/1989 | Rose et al. |
| 4,847,504 A | 7/1989 | Aitken |
| 4,859,908 A | 8/1989 | Yoshida et al. |
| 5,126,575 A | 6/1992 | White |
| 5,134,301 A | 7/1992 | Kamata et al. |
| 5,189,303 A | 2/1993 | Tanjyo et al. |
| 5,216,253 A | 6/1993 | Koike |
| 5,343,047 A | 8/1994 | Ono et al. |

(Continued)

FOREIGN PATENT DOCUMENTS

EP    0 135 366    3/1985

(Continued)

OTHER PUBLICATIONS

M. Naito et al. "High Current Ion Implantation System for Research Use, PR-200A-RD", The Nissin Electric Review, vol. 35, No. 2, 1990, pp. 25-31.

(Continued)

*Primary Examiner*—Kiet T. Nguyen
(74) *Attorney, Agent, or Firm*—Fish & Richardson P.C.

(57) ABSTRACT

There is proposed an apparatus for doping a material to be doped by generating plasma (ions) and accelerating it by a high voltage to form an ion current is proposed, which is particularly suitable for processing a substrate having a large area.

The ion current is formed to have a linear sectional configuration, and doping is performed by moving a material to be doped in a direction substantially perpendicular to the longitudinal direction of a section of the ion current.

23 Claims, 6 Drawing Sheets

U.S. PATENT DOCUMENTS

| | | | |
|---|---|---|---|
| 5,389,793 A | 2/1995 | Aitken et al. | |
| 5,397,956 A | 3/1995 | Araki et al. | |
| 5,424,244 A | 6/1995 | Zhang et al. | |
| 5,696,382 A | 12/1997 | Kwon | |
| 5,721,687 A | 2/1998 | Lamartine et al. | |
| 5,760,405 A | 6/1998 | King et al. | |
| 5,767,522 A | 6/1998 | Kodama | |
| 5,804,471 A | 9/1998 | Yamazaki et al. | |
| 5,825,035 A * | 10/1998 | Mizumura et al. | 250/423 R |
| 5,837,568 A | 11/1998 | Yoneda et al. | |
| 5,839,793 A | 11/1998 | Merrick et al. | |
| 5,849,043 A | 12/1998 | Zhang et al. | |
| 5,858,819 A | 1/1999 | Miyasaka | |
| 6,059,873 A | 5/2000 | Yamaguchi et al. | |
| 6,160,262 A | 12/2000 | Aoki et al. | |
| 6,165,876 A | 12/2000 | Yamazaki et al. | |
| 6,329,229 B1 | 12/2001 | Yamazaki et al. | |
| 6,336,969 B1 | 1/2002 | Yamaguchi et al. | |
| 6,716,283 B2 | 4/2004 | Yamaguchi et al. | |
| 6,734,446 B1 * | 5/2004 | Yamazaki et al. | 250/492.21 |
| 6,897,100 B2 | 5/2005 | Yamazaki et al. | |
| 2002/0059896 A1 | 5/2002 | Yamaguchi et al. | |
| 2004/0191945 A1 | 9/2004 | Yamaguchi et al. | |
| 2004/0211356 A1 | 10/2004 | Yamazaki et al. | |

FOREIGN PATENT DOCUMENTS

| | | |
|---|---|---|
| EP | 0 137 649 | 4/1985 |
| EP | 0 139 377 | 5/1985 |
| EP | 0 145 119 | 6/1985 |
| EP | 0 145 120 | 6/1985 |
| EP | 0 405 855 | 1/1991 |
| EP | 0 525 927 | 9/1995 |
| JP | 55-124237 | 9/1980 |
| JP | 60-105153 | 6/1985 |
| JP | 60-107246 | 6/1985 |
| JP | 62-051147 | 3/1987 |
| JP | 63-157868 | 6/1988 |
| JP | 64-001455 | 1/1989 |
| JP | 03-269940 | 12/1991 |
| JP | 04-104441 | 4/1992 |
| JP | 04-160744 | 6/1992 |
| JP | 04-160745 | 6/1992 |
| JP | 04-230944 | 8/1992 |
| JP | 05-082083 | 4/1993 |
| JP | 05-128984 | 5/1993 |
| JP | 06-060099 | 8/1994 |
| JP | 06-252079 | 9/1994 |
| JP | 06-260436 | 9/1994 |
| JP | 06-291073 | 10/1994 |
| JP | 06-349429 | 12/1994 |
| JP | 07-007060 | 1/1995 |
| JP | 07-161337 | 6/1995 |
| JP | 07-283151 | 10/1995 |
| JP | 08-051078 | 2/1996 |
| JP | 08-077961 | 3/1996 |
| JP | 08-096742 | 4/1996 |
| JP | 09-298043 | 11/1997 |
| KR | 94-0006193 | 3/1994 |

OTHER PUBLICATIONS

N. Nagai et al. "New Generation Parallel Beam Implanter EXCEED 2000", The Nissin Electric Review, vol. 39, No. 3, 1994, pp. 9-18.

"Nikkei Microdevices", May 1996, p. 89.

* cited by examiner

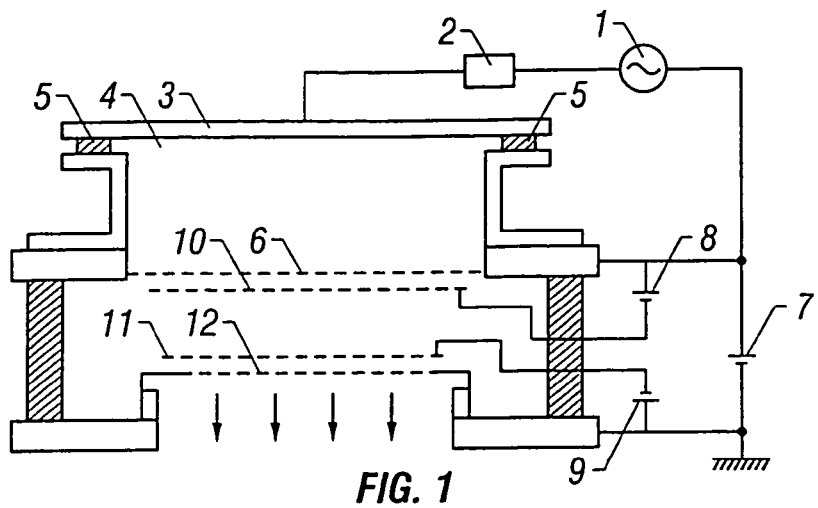
FIG. 1
*(Prior Art)*
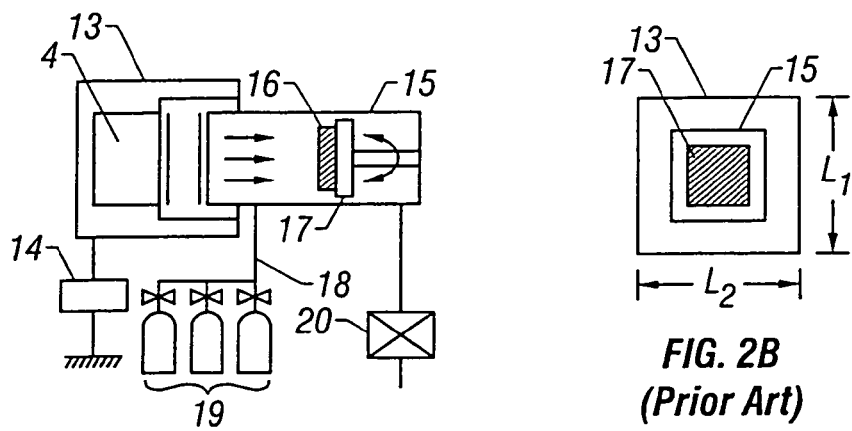
FIG. 2A
*(Prior Art)*
FIG. 2B
*(Prior Art)*
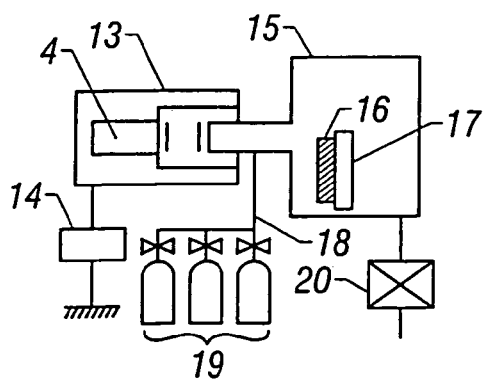
FIG. 3A
*(Prior Art)*
FIG. 3B
*(Prior Art)*

APPARATUS AND METHOD FOR DOPING

CROSS-REFERENCE TO RELATED APPLICATIONS

This application is a continuation application of U.S. application Ser. No. 09/235,143, filed Jan. 21, 1999, now U.S. Pat. No. 7,118,996, which is a continuation of U.S. application Ser. No. 08/855,818, filed May 12, 1997, now U.S. Pat. No. 5,892,235, and claims the benefit of foreign priority applications filed in Japan as Serial No. 08-146634 on May 15, 1996 and as Serial No. 08-281874 on Oct. 3, 1996. This application claims priority to each of these prior applications, and the disclosures of the prior applications are considered part of (and are incorporated by reference in) the disclosure of this application.

BACKGROUND OF THE INVENTION

1. Field of the Invention

The present invention relates to a doping apparatus and a method of doping used for the manufacture of semiconductor integrated circuits and the like. More particularly, the present invention relates to an ion doping apparatus and a method of doping having a configuration preferable for processing substrates having large areas, wherein ion beams are radiated to a semiconductor material composed of amorphous components partly or entirely or to a substantially intrinsic polycrystalline semiconductor material to supply impurities to the semiconductor material.

2. Description of Related Art

Methods of forming p-type and n-type impurity regions in a semiconductor during the manufacture of semiconductor integrated circuits and the like are known in which ions of impurities that produce n and p conductivity types (n-type impurities and p-type impurities) are radiated and implanted by accelerating them by a high voltage. Especially, a method of separating mass and charge ratio of ions is referred to as "ion implantation" and are widely used for the manufacture of semiconductor integrated circuits.

Another method is known in which plasma including n-type and p-type impurities is produced and ions in the plasma are accelerated by a high voltage to be implanted in a semiconductor as an ion current. This method is referred to as "ion doping" or "plasma doping".

The structure of a doping apparatus utilizing ion doping is simpler than that of a doping apparatus utilizing ion implantation. For example, to implant boron as p-type impurities, plasma is produced in a gas of diborane ($B_2H_6$) which is a boron compound by means of RF discharge or the like and a high voltage is applied to the plasma thereto to extract ions including boron which are in turn radiated into a semiconductor. Since gas-phase discharge is performed to produce plasma, the degree of vacuum inside the doping apparatus is relatively high.

Presently, an ion doping apparatus is frequently used to add impurities uniformly to a substrate having a relatively large area. This is because an ion beam to cover a large area can be relatively easily obtained in an ion doping apparatus which does not perform separation on a mass basis. On the other hand, for an ion implantation apparatus which must perform separation on a mass basis, it is difficult to increase the area of a beam while maintaining the uniformity of the ion. Therefore, an ion implantation apparatus is unsuitable for a substrate having a large area.

Recently, studies are active on the reduction of the temperature for semiconductor device processing. This is largely because of the fact that a necessity has arisen to form semiconductor devices on inexpensive insulated substrates made of glass and the like. Other reasons include needs associated with the trend toward microscopic devices and multi-layer devices.

Insulated substrates made of glass or the like have various advantages compared to silica substrates which have been used in processing at high temperatures in that they are easy to process, easy to form with a large surface area, inexpensive, and so on. However, as a matter of fact, the trend toward substrates having larger areas has also resulted in various difficulties to be technically overcome including a need for developing apparatuses having characteristics different from those suitable for conventional processes at high temperatures.

Ion implantation is disadvantageous for the manufacture of active matrix type liquid crystal displays and like wherein substrates having a large area must be processed, and ion doping is under research and development in an intention to cover such a disadvantage.

FIGS. 1 and 2 schematically illustrate a conventional ion doping apparatus. FIG. 1 schematically illustrates an ion source and an ion accelerator mainly. FIG. 2 illustrates the structure of the ion doping apparatus as a whole. The description will first proceed with reference to FIG. 1. Ions are generated in a plasma space 4.

Specifically, radio-frequency power is applied between an electrode 3 and a mesh electrode 6 by a radio-frequency power supply 1 and a matching box 2 to generate plasma in the plasma space 4 under a reduced pressure. Hydrogen or the like is introduced at the initial stage of plasma generation, and diborane and phosphine ($PH_3$) which are doping gases are introduced after the plasma is stabilized.

The electrode 3 and the outer wall of the chamber (at the same potential as that of the mesh electrode 6) are insulated from each other by an insulator 5. An ion current is extracted from the plasma thus generated by an extraction electrode 10 and an extraction power supply 8. The ion current thus extracted is shaped by a suppressor grid 11 and a suppressor power supply 9 and thereafter accelerated into required energy by an acceleration electrode 12 and an acceleration power supply 7.

FIG. 2(A) will now be described. The ion doping apparatus is generally comprised of an ion source/accelerator 13, a doping chamber 15, a power supply device 14, a gas box 19, and an exhaust device 20. In FIG. 2, the ion source/accelerator as in FIG. 1 arranged horizontally. That is, in FIG. 2, the ion current flows to the right (downward in FIG. 1). The power supply device 14 mainly consists of power supplies used for generation and acceleration of ions and includes the radio-frequency power supply 1, matching box 2, acceleration power supply 7, extraction power supply 8, and suppressor power supply 9.

A substrate holder 17 is provided in the doping chamber 15, and a material 16 to be doped is placed thereon. In general, the substrate holder is designed such that it can be rotated about an axis in parallel with the ion current. The air in the ion source/accelerator 13 and the doping chamber 15 is exhausted by the exhaust device 20. The air in the ion source/accelerator 13 and the doping chamber 15 may be exhausted by separate exhaust devices.

A doping gas is delivered from the gas box 19 to the doping chamber 15 through a gas line 18. While a gas intake port is provided between the ion source/accelerator 13 and the material 16 to be doped in the apparatus shown in FIG. 2(A), it may be provided in the vicinity of the plasma space 4 of the ion source. The doping gas is generally used by diluting it with hydrogen or the like.

In the conventional ion doping apparatus, the area of a substrate (material to be doped) has been equal to or smaller than the sectional area of the plasma space 4 in the ion source 13. This is a requirement to be satisfied to achieve uniform doping. FIG. 2(B) illustrates a section which is perpendicular to the ion current. Specifically, the ion source/accelerator 13 has a size represented by $L_1$ and $L_2$, and the doping chamber 15 and a material 17 to be doped are sized such that they can be contained therein. The dimensions $L_1$ and $L_2$ are about the same.

Therefore, the size of the plasma space 4 must be increased with the size of the substrate. Further, plasma must have two-dimensional uniformity. However, it is difficult to increase the size of the plasma space infinitely. The reason is that this makes the generation of plasma nonuniform. This is primarily attributable to the fact that the mean free path of molecules becomes sufficiently smaller than the section of the plasma space. It is therefore difficult to make the length of one side of the plasma space equal to or greater than 0.6 m.

SUMMARY OF THE INVENTION

The present invention is characterized in that an ion current is shaped to have a linear or rectangular section and in that a material to be doped is moved perpendicularly to the longitudinal direction of the ion current (i.e., in the direction of the shorter dimension of the ion current). As a result, plasma is required to be uniform only in the longitudinal direction, and this makes it possible to process a substrate having a large area. What is to be considered is only the uniformity of plasma in the longitudinal direction and not two-dimensional uniformity because irradiation with ions is carried out by scanning in any part of the material to be doped.

According to the present invention, in principle, while the length of one side of a substrate is limited by the length of plasma, there is no factor limiting the length of another side of the substrate other than the size of the doping chamber. It is easy to generate plasma whose uniformity is maintained for about two meters in the longitudinal direction thereof if the width of the discharge space is sufficiently small. It goes without saying that the width of the ion beam is on the order of centimeters.

Therefore, such a linear ion doping apparatus is suitable for processing a substrate having a large area and processing a multiplicity of substrates simultaneously. For example, it can relatively easily dope substrates of sizes up to 2 m×x m where x is determined by the size of the doping apparatus.

FIG. 3(A) illustrates the conception of the present invention. An ion doping apparatus according to the present invention comprises an ion source/accelerator 13, a doping chamber 15, a power supply device 14, a gas box 19, and an exhaust device 20 as in the prior art. Unlike the prior art, however, the ion source/accelerator 13 generates an ion current having a linear or rectangular section. Further, a substrate holder 17 includes a mechanism which moves during doping. The longitudinal direction of the ion current is a direction perpendicular to the plane of the drawing.

In the ion doping apparatus according to the present invention, the shape of a substrate (material to be doped) that can be processed has no relationship with the sectional shape of a plasma space 4 in the ion source 13. However, the length of one of the shorter sides of the substrates must be equal to or less than the length of the plasma space 4 in the longitudinal direction thereof. There is no factor that limits the size of another side of the substrate other than the size of the doping chamber.

FIG. 3(B) illustrates a section perpendicular to the ion current. Specifically, the shape of the ion source/accelerator 13 ($L_1 \times L_2$) is not limited by the shapes of the doping chamber 15 and a material 17 to be doped. Since the ion current has a linear or rectangular sectional shape, $L_1 < L_2$ (=the longer dimension of the section of the ion current).

The statement that an ion current is required to be uniform only in the direction of the longer dimension and not in the direction of the shorter dimension thereof implies that no problem arises even if there is distribution of ionic strength and ionic species in the direction of the shorter dimension of the ion current. This is advantageous in removing certain light ions (e.g., H+ and $H_2$+) from the ion current. It has been necessary to exert a magnetic action on an ion current to separate ions therein, which has inevitably affected the distribution of heavy ions which have been required.

With conventional ion doping apparatuses in which two-dimensional uniformity has been required, it is substantially impossible to separate ions. According to the present invention, however, it is easy to perform separation as shown in a second embodiment thereof.

The fact that an ion current is required to be uniform only in the direction of the longer dimension and not in the direction of the shorter dimension thereof is advantageous from the viewpoint of the structure of an electrode for accelerating and decelerating the ion current. A mesh-like or porous electrode has been frequently used in conventional ion doping apparatuses. However, in the case of such an electrode, since a part of ions collide with the main body of the electrode, deterioration of the electrode or splashing and sputtering of substances that form the electrode can be a problem.

On the contrary, according to the present invention, the above-described problem is solved because an electrode having a simple configuration is provided in a position apart from an ion current as shown in a first embodiment.

Known conventional semiconductor manufacturing techniques include ion implantation which involves a known technique for scanning an ion current across a fixed substrate by electromagnetically deflecting the same. However, such a method is unsuitable for doping ions having various mass-to-charge ratios as in the present invention, and it is preferable to move the substrate with the ion current fixed as carried out according to the present invention.

The reason is that, according to the technique for electromagnetically deflecting an ion current, light ions are much easily deflected than heavy ions and therefore can not be scanned uniformly. Since a difference of only one in mass numbers can cause distribution, it is not preferable to apply this technique to ion doping techniques to which the present invention is directed. The use of such a technique for electromagnetic deflection is limited to doping of only one ion species.

An ion doping apparatus according to the present invention may be added with an ion focusing apparatus and an ion mass separating apparatus which are well known in the prior ion-related art.

In a linear ion doping technique like the present invention, the feature of easy ion mass separation can result in an advantage also in a subsequent annealing process. In general, when ion doping is performed, the incidence of ions upon the substance being irradiated can result in damage to a lattice of atoms of the substance under irradiation, transition of a lattice into an amorphous state, and the like.

Further, it is not possible to cause the dopant to work as a carrier by simply implanting it in a semiconductor material. Several steps are required to follow doping in order to solve these problems.

The most popular method employed in such steps is thermal annealing or optical annealing. Dopant can be combined with a lattice of a semiconductor material by performing such annealing. In the case of optical annealing, however, light must reach a location where damage to a lattice has occurred or the like as described above.

It is considerably common to perform another step of adding hydrogen to eliminate levels (uncombine arms) which have survived the above-described annealing. Such a step is referred to as "hydrogenation". Hydrogen easily enters in a semiconductor material at a temperature on the order of 350° C. and eliminates the levels as described above.

In any case, the inclusion of such steps after doping is not preferable from the viewpoint of cost and throughput because it increases the number of steps. By performing thermal annealing and hydrogenation simultaneously with doping or performing a part of those steps during doping, it is possible to eliminate separate steps for annealing and hydrogenation, to reduce processing time or to decrease the processing temperature.

It is relatively easy to add hydrogen and dopant in a semiconductor material simultaneously. Specifically, doping may be performed by diluting dopant with hydrogen and ionizing it together with hydrogen. For example, if ion implantation is carried out by the doping apparatus as shown in FIGS. 1 and 2 using phosphine ($PH_3$) diluted with hydrogen, hydrogen ions (e.g., $H_2+$ and $H+$) will be implanted along with ions including phosphorus (e.g., $PH_3+$ and $PH_2+$).

However, since hydrogen is too light and easily accelerated compared to ions including dopant such as phosphorus and boron, it penetrates too deep in the substrate. On the other hand, ions including dopant stay in a relatively shallow region. Therefore, in order for hydrogen to correct defects caused by dopant, hydrogen must be moved by means of thermal annealing or the like.

Meanwhile, the use of a linear ion beam makes it possible to irradiate a substrate with only desired ions by providing a mass separator on the way of an ion current as described above. A new doping method as described below can be derived from such an idea. That is a doping method wherein ions having different mass are separated and then accelerated at different voltages, and resultant beams are radiated to a semiconductor material to implant those ions to substantially the same depth.

For example, separation is performed to obtain ions mainly composed of hydrogen (light ions) and ions including dopant (heavy ions), and only the latter is accelerated to make the depths of penetration of the light and heavy ions substantially the same. Thus, the presence of the light ions makes it possible to simultaneously perform a part of or all of an annealing step and a hydrogenation step on the dopant.

Specifically, the speed of incidence of a hydrogen ion beam upon a semiconductor material is made close to the speed of incidence of an ion beam containing the dopant upon the semiconductor material. As a result, the distribution of hydrogen in the semiconductor film is made close to the distribution of the dopant. At this time, the dopant is immediately activated by incidence energy of ions (which is converted into thermal energy as a result of collision) and the presence of hydrogen. This effect allows a subsequent dopant activation step to be eliminated.

The depth of penetration of each ion beam may be adjusted by changing its angle of incidence. The smaller the angle of incidence, the smaller the depth of penetration. The angle of incidence may be changed by magnetic and electrical effects. Ions can not enter a substrate and are reflected therefrom if the angle of incidence is too small. An angle of incidence of 40° or more will be sufficient.

For the above-described purpose, a mass separator may be provided between an ion beam generator and an accelerator. Further, mass separation can be performed on an ion beam using an apparatus which applies a magnetic field in parallel with the longitudinal direction of the ion beam.

Ion implantation into a semiconductor material may be carried out by implanting ions including dopants first and implanting ions mainly composed of hydrogen thereafter or may be performed in the reversed order.

It will be advantageous to provide an ion doping apparatus and a laser annealing apparatus utilizing a linear laser beam according to the present invention in the same chamber. Specifically, it is much more advantageous to combining them into a single apparatus than providing them as separate apparatuses considering the fact that the present invention is characterized by a step of doping a substrate while scanning it with a linear ion current; a laser annealing process utilizing a linear laser beam according to another aspect of the invention needs a similar mechanism to be implemented; and steps utilizing those apparatuses are performed consecutively.

For example, Japanese unexamined patent publication (KOKAI) No. H7-283151 discloses a multi-chamber vacuum processing apparatus including an ion doping chamber and a laser annealing chamber. The idea of integrating an ion doping chamber and a laser annealing chamber has not been adopted in conventional ion doping apparatuses which have been based on irradiation using an ion current having a planar section at a time and which have sometimes required a substrate to be rotated.

However, according to the present invention wherein an ion doping apparatus performs doping while moving a substrate with a transport mechanism similar to that of a linear laser annealing apparatus, there is no need for providing an ion doping chamber and a laser annealing chamber separately, and it is rather advantageous to integrate them from the viewpoint of productivity on a mass production basis. Specifically, an arrangement may be made wherein the longitudinal direction of a section of an ion current is in parallel with the longitudinal direction of a section of a laser beam and wherein a substrate is moved between them perpendicularly to the above-mentioned directions. This makes it possible to perform an ion doping step and a laser annealing step consecutively.

The combination of a linear ion processing apparatus with a linear laser annealing apparatus has an advantage, in addition to the advantage of reducing the number of steps by performing the two steps simultaneously, in that the possibility of contamination of a substrate is reduced.

Further, the use of an ion doping apparatus according to the present invention allows a doping process having features as described below. A first method of doping according to the present invention comprises the steps of generating a linear ion beam, separating the ion beam into at least two ion beams through mass separation on the ion beam, accelerating the ion beams by different voltages, and radiating the ion beams to a substrate at different angles.

A second method of doping according to the present invention is characterized in that it comprises the steps of generating a linear ion beam, performing mass separation on the ion beam to obtain at least two kinds of ion beams, accelerating one of the ion beams by an acceleration voltage different from that for the other, and radiating the at least two ion beams to a substrate while moving the substrate in a direction substantially perpendicular to the linear direction of the linearly processed ion beams.

A third method of doping according to the present invention is characterized in that it comprises the steps of generating a linear ion beam including hydrogen, separating the ion beam on a mass basis into an ion beam mainly composed of hydrogen and another ion beam, applying energy and incident angles to the ion beam mainly composed of hydrogen and the other such that the depths of penetration of those ion beams into a substrate substantially equal each other, and radiating the ion beams to the substrate while moving the substrate in a direction substantially perpendicular to the linear direction of the linearly processed ion beams.

A more detailed description of the present invention will be made later with reference to the accompanying drawings.

BRIEF DESCRIPTION OF THE DRAWINGS

FIG. 1 schematically illustrates an ion source/accelerator of a conventional ion doping apparatus.

FIGS. 2(A) and 2(B) schematically illustrate a configuration of a conventional ion doping apparatus.

FIGS. 3(A) and 3(B) schematically illustrate a configuration of an ion doping apparatus according to the present invention.

FIG. 6(A) schematically illustrates an ion source/accelerator of an ion doping apparatus according to a third embodiment of the present invention.

FIGS. 6(B), 6(C), 6(D), and 6(E) illustrate principles of operation of the third embodiment.

FIGS. 10(A), 10(B), 10(C), and 10(D) are views showing the relationship between the speed of incidence of ions and the depth of penetration of the same.

DETAILED DESCRIPTION OF PREFERRED EMBODIMENTS

First Embodiment

Figure 4A:
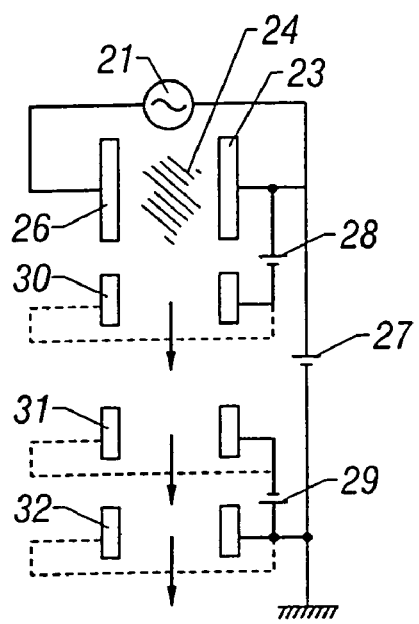
FIG. 4(A) schematically illustrates an ion source/accelerator of an ion doping apparatus according to a first embodiment of the present invention.
Figure 4B:
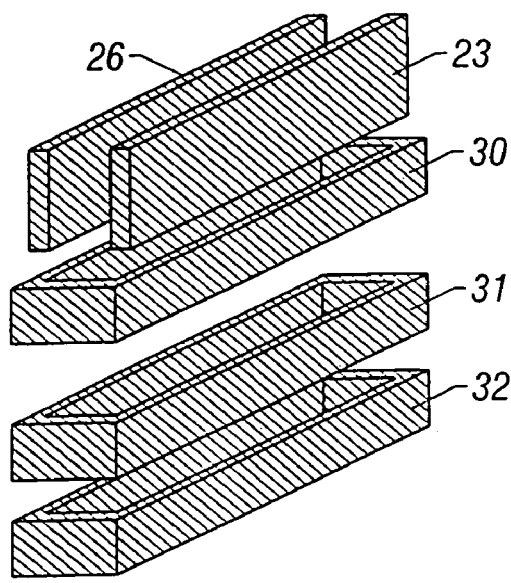
FIG. 4(B) schematically illustrates a configuration of electrodes of the first embodiment.

A first embodiment of the present invention will now be described. FIGS. 4(A) and 4(B) illustrate the present embodiment. FIG. 4(A) schematically illustrates an ion source/accelerator of an ion doping apparatus according to the present embodiment, and 4(B) schematically illustrates a configuration of electrodes of the ion source/accelerator of the present embodiment. The description will first proceed with reference to FIG. 4(A).

In a plasma space 24 having a rectangular section, a radio-frequency power is applied between plasma generation electrodes 23 and 26 by a radio-frequency power supply 21 to generate plasma. This plasma is extracted by an extraction electrode 30 and an extraction power supply 28, conditioned by a suppressor electrode 31 and a suppressor power supply 29 in terms of the shape and distribution thereof, and thereafter accelerated by an acceleration electrode 32 and an acceleration power supply 27 into required energy. If the plasma is sufficiently uniform in the longitudinal direction thereof, it is not necessary to provide the suppressor electrode 31.

FIG. 4(B) illustrates a configuration of the plasma generation electrodes 23 and 26, the extraction electrode 30, the suppressor electrode 31, and the acceleration electrode 32. Specifically, the extraction electrode 30, the suppressor electrode 31, and the acceleration electrode 32 have a cavity through which an ion current flows at the center thereof. Therefore, no ion collides with the electrodes.

In the present embodiment, the plasma generation electrodes 23 and 26 may be spaced from each other by 1 to 10 cm and may have a length of 50 to 150 cm; the shorter dimension of sections of the cavities in the extraction electrode 30, the suppressor electrode 31, and the acceleration electrode 32 may be 1 to 15 cm; and the longer dimension thereof may be 50 to 170 cm.

This ion doping apparatus may have a general configuration similar to that shown in FIGS. 3(A) and 3(B).

According to the present embodiment, ions are introduced without being subjected to mass separation. Therefore, when phosphine diluted with hydrogen is used as a doping gas for example, both of heavy ions ($PH_3+$, $PH_2+$ etc.) and light ions (H+, $H_2+$ etc.) are introduced with the same areal density. The same thing occurs when boron or antimony is implanted.

This is advantageous in that recrystallization occurs at a low temperature. Specifically, Si—H combinations in the material are subjected to a condensation process in which hydrogen molecules are desorbed to form Si—Si combinations. This differentiates the present embodiments from second and third embodiments in which implantation of hydrogen molecules is actively prevented.

It should be noted that the depth of penetration varies depending on the mass and radius of ions in the present embodiment. In general, light hydrogen-type ions concentrate in a much deeper region.

Embodiments for correcting this will be described later (fifth, sixth, and seventh embodiments).

Second Embodiment

Figure 5A:
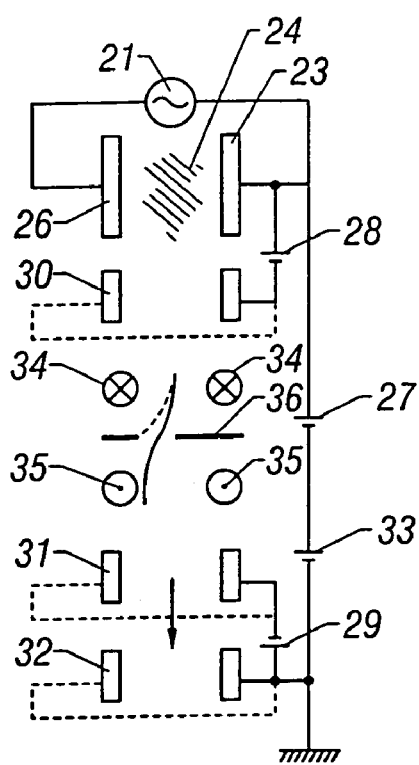
FIG. 5(A) schematically illustrates an ion source/accelerator of an ion doping apparatus according to a second embodiment of the present invention.

A second embodiment of the present invention will now be described. The present embodiment shows an example in which a mass separator is provided in the ion source/ion accelerator in the ion doping apparatus shown in the first embodiment. The present embodiment will be described with reference to FIGS. 5(A), 5(B), and 5(C). FIG. 5(A) schematically illustrates a configuration of an ion source/accelerator according to the present embodiment. The description will now first proceed with reference to FIG. 5(A). In the plasma space 24, radio-frequency power is applied to the plasma generation electrodes 23 and 26 by the radio-frequency power supply 21 to generate plasma.

This plasma is extracted by the extraction electrode 30 and the extraction power supply 28 and is accelerated by the acceleration power supply 27. Then, it passes through magnetic fields 34 and 35 in opposite directions and a slit 36 provided therebetween. The ions are subjected to a lateral force in the magnetic field 34. As a result, light ions (e.g., H+ and $H_2$+) indicated by the dotted line in FIG. 5(A) are deflected more to the left than heavy ions (e.g., $BH_3$+, $BH_2$+, $PH_3$+, and $PH_2$+ which are indicated by the thin line in FIG. 5(A)) and therefore can not pass through the slit 36. That is, the slit 36 is provided for separation on a mass basis.

Figure 5B:
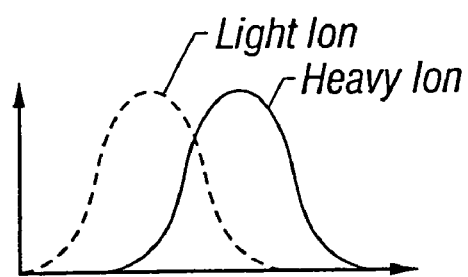
FIGS. 5(B) and 5(C) illustrate principles of operation of the second embodiment.
Figure 5C:
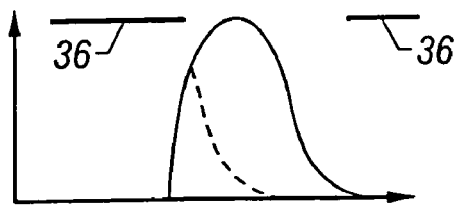

FIG. 5(B) is a conceptual illustration of the distribution of the ions before they enter the slit. The ordinate represents the density of the ions (ionic strength), and the abscissa represents the direction of the shorter dimension of a section of the ion current. The ions reflect the distribution of the plasma and have a shape that resembles Gaussian distribution. Light ions is moved to the left by the magnetic field 34. FIG. 5(C) shows the distribution of the ions after they pass through the slit. The slit 36 eliminates the peak of the light ions located leftward from the ion current. Thus, separation on a mass basis can be carried out on the ion current.

Even after passing through the slit 36, the distribution of the ion current is still under strong influence of the magnetic field 34 in the direction of the shorter dimension thereof and is different from that in the plasma space. However, this results in no problem because doping is performed by moving the ion current as described above.

After passing through the slit 36, the ion current is subjected to a rightward force in the magnetic field 35 which is in the direction opposite to the magnetic field 34 to correct the path thereof. Since the forces applied to the ions in the magnetic fields 34 and 35 have opposite directions and the same magnitude, the ion current finally becomes in parallel with the initial flow.

Thereafter, the ions are conditioned by the suppressor electrode 31 and the suppressor power supply 29 in terms of its shape and distribution and then accelerated by the acceleration electrode 32 and an acceleration power supply 33 into required energy. It is not necessary to provide the suppressor electrode 31 if the plasma is sufficiently uniform in the longitudinal direction thereof. The apparatus and slit for applying magnetic fields as in the present embodiment may be located between the suppressor electrode and the acceleration electrode or between the acceleration electrode and a material to be doped.

When light hydrogen-type ions are to be removed as in the present embodiment, the condensation reaction for desorbing hydrogen during recrystallization as described with reference to the first embodiment is not likely to occur. In order to solve this problem, doping of only hydrogen may be performed before or after a step of doping impurities of interest to a similar depth.

Third Embodiment

A third embodiment of the present invention will now be described. The present embodiment shows an example wherein an ion focusing device is provided in an ion source/ion accelerator of an ion doping apparatus including a simple mass separator. The present embodiment will be described with reference to FIGS. 6(A) through 6(E).

FIG. 6(A) schematically illustrates a configuration of the ion source/accelerator of the present embodiment. The description will first proceed with reference to FIGS. 6(A) and 6(B). FIG. 6(A) is a view of an ion current taken in the longitudinal direction of a section thereof, and FIG. 6(B) is a view of the ion current taken from a plane perpendicular to the longitudinal direction of the section.

The ion source of the present embodiment employs a plasma generation method of induced excitation type unlike the first and second embodiments. For this purpose, a silica tube is used in a part of a gas line 58, and an induction coil 43 is wound around it. The coil 43 is connected to a radio-frequency power supply 41. One end of the coil is grounded. A downstream current of the ion current is grounded in the first and second embodiments. On the contrary, an upstream current of the ion current is grounded in the present embodiment.

The advantage of this arrangement is that the gas line can be used around the level of the ground especially in cases such as induced excitation in a thin tube. When the gas line is provided in the middle of an ion current as in the first and second embodiments, the potential of the gas line is not so critical. However, if a downstream current of ions is grounded in an apparatus as in the present embodiment, the potential around the gas line can reach a voltage as high as 100 kV. Since conductive materials are used for the gas piping and gas bomb, it is necessary to extend strict insulation up to the gas box and the like.

When an upstream current of ions is grounded as in the present embodiment, a downstream current will conversely have a (negative) high potential. However, since only a few materials located downstream are in communication with the outside, insulation is not critical for such materials.

The plasma generated by the induction coil 43 is introduced in an acceleration chamber 44. The intake port to the acceleration chamber has a unique configuration as shown in FIG. 6(B). At this time, since gases are introduced from the thin tube into a reaction chamber having a large capacity, the pressure and density of the plasma and doping gases decrease rapidly.

This is preferable when an ion current is to be focused as in the present embodiment. In general, the pressure in the gas line 58 at the area of the induction coil may be $\frac{1}{5}$ to $\frac{1}{100}$ of the pressure in the acceleration chamber 44. A pressure of $10^{-4}$ Torr or more is required to generate plasma.

However, the mean free path of molecules or ions of a gas becomes small in a space under a high pressure, and this is disadvantageous in accelerating ions into high energy. Further, when an ion current is to be focused as in the present embodiment, scattering caused by ion collision reduces the level of focusing.

The above-described problem can be solved by making the pressure in the acceleration chamber 44 significantly lower than that in the plasma source (in the vicinity of the induction coil 43). In order to enhance the focusing of an ion current, a pressure is preferably provided such that the distance between the focusing device and a material to be doped is equal to or less than the mean free path.

The plasma introduced into the acceleration chamber as described above is extracted by the extraction electrode 50 (and the extraction power supply 48) and is accelerated by the acceleration electrode 52 (and the acceleration power supply 47). A coil 51 for focusing an ion current is provided between the extraction electrode 50 and the acceleration electrode 52. The coil 51 has a configuration different from that of a normal solenoid.

Specifically, the diameter of the coil is gradually reduced as it extends downstream in the focusing direction of an ion current. On the other hand, the diameter is kept unchanged in the direction perpendicular thereto. This allows the ion current to be focused in one direction. The coil 51 may be replaced with a hollow permanent magnet having a similar configuration.

What described above is a method of confining or focusing plasma referred to as "z pinch method" in principle. Alternatively, it is possible to employ a self-focusing method wherein an ion current is focused by a magnetic field generated by itself. In this case, an acceleration electrode having a multiplicity of stages may be provided whose diameter is reduced as it extends downward. Further, when the self-focusing method is used, if an electron current is applied in the direction opposite to that of an ion current, the amount of the electrical current will be increased and repulsion between ions will be blocked by electrons (shield effect). This will enhance the focusing effect.

Then, the ion current passes through magnetic fields 54 and 55 in opposite directions and a slit 56 provided therebetween. The ions are subjected to a leftward force in the magnetic field 54. As a result, light ions (indicated by the dotted line in FIG. 6(A)) are deflected further to the left than heavy ions (indicated by the thin line in FIG. 6(A)) and therefore can not pass through the slit 56. This is similar to what occurs in the second embodiment. In the present embodiment, however, a more significant effect can be achieved because the ion current is focused.

FIG. 6(C) is a conceptual illustration of the distribution of the ions which have passed through the acceleration electrode 52. The ordinate represents the density of the ions (ionic strength), and the abscissa represents the direction of the shorter dimension of a section of the ion current. While the ions reflect the distribution of the plasma and have a shape that resembles Gaussian distribution, light ions are more strongly focused than heavy ions to be concentrated to a central region.

Figure 6E:
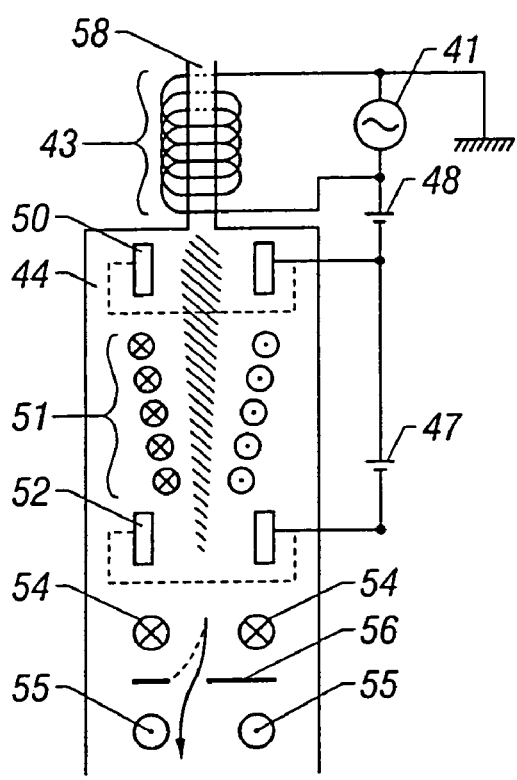
Figure 6E:
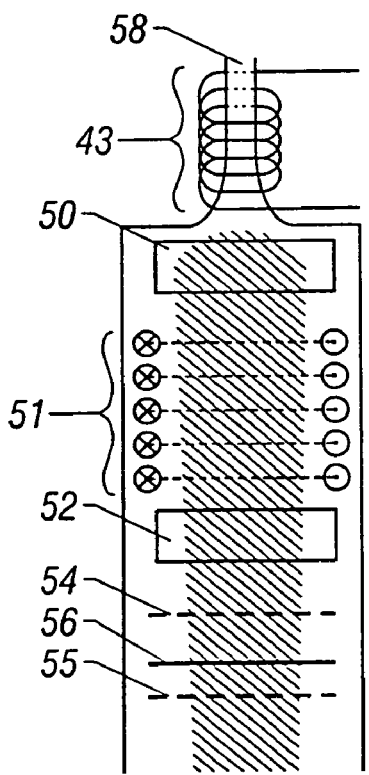
Figure 6E:
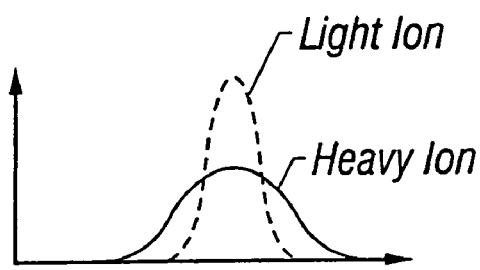
Figure 6E:
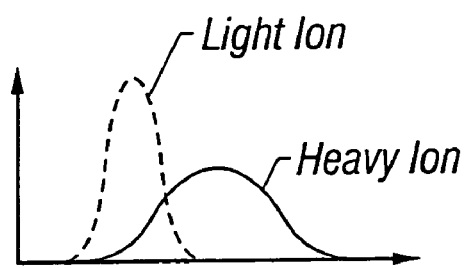
Figure 6E:
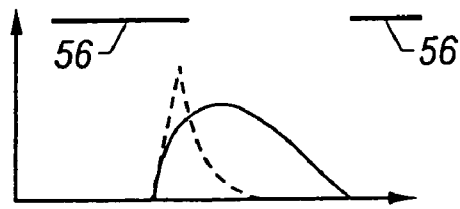

When the ion current having such distribution passed through the magnetic field 54, light ions move to the left as in the second embodiment. FIG. 6(D) is a conceptual illustration of the distribution of the ions before they enter the slit. FIG. 6(E) shows the distribution of the ions after they pass through the slit. The slit 56 eliminates the peak of the light ions located leftward from the ion current. Thus, separation on a mass basis can be carried out on the ion current. The present embodiment is characterized in that the slit provides a more significant effect of separation because the light ions are concentrated at a higher degree.

After passing through the slit 56, the ion current is subjected to a rightward force in the magnetic field 55 to correct the path thereof. Since the forces applied to the ions in the magnetic fields 54 and 55 have opposite directions and the same magnitude, the ion current finally becomes in parallel with the initial flow.

Thus, an ion current having a linear section can be obtained.

Fourth Embodiment

A fourth embodiment of the present invention will now be described. The present embodiment relates to an apparatus in which an ion doping apparatus and a laser annealing apparatus utilizing a linear laser beam according to the present invention are provided in the same chamber. Specifically, the present embodiment has been conceived considering the fact that the present invention is characterized by a step of doping a substrate while scanning it with a linear ion current; and a laser annealing process utilizing a linear laser beam according to another aspect of the invention needs a similar mechanism to be implemented.

For example, Japanese unexamined patent publication (KOKAI) No. H7-283151 discloses a multi-chamber vacuum processing apparatus including an ion doping chamber and a laser annealing chamber. The idea of integrating an ion doping chamber and a laser annealing chamber has not been adopted in conventional ion doping apparatuses which have been based on irradiation using an ion current having a planar section at a time and which have sometimes required a substrate to be rotated.

However, according to the present invention wherein an ion doping apparatus performs doping while moving a substrate with a transport mechanism similar to that of a linear laser annealing apparatus, there is no need for providing an ion doping chamber and a laser annealing chamber separately, and it is rather advantageous to integrate them from the viewpoint of productivity on a mass production basis. Specifically, an arrangement may be made wherein the longitudinal direction of a section of an ion current is in parallel with the longitudinal direction of a section of a laser beam and wherein a substrate is moved between them perpendicularly to the above-mentioned directions. This makes it possible to perform an ion doping step and a laser annealing step consecutively.

Figure 7A:
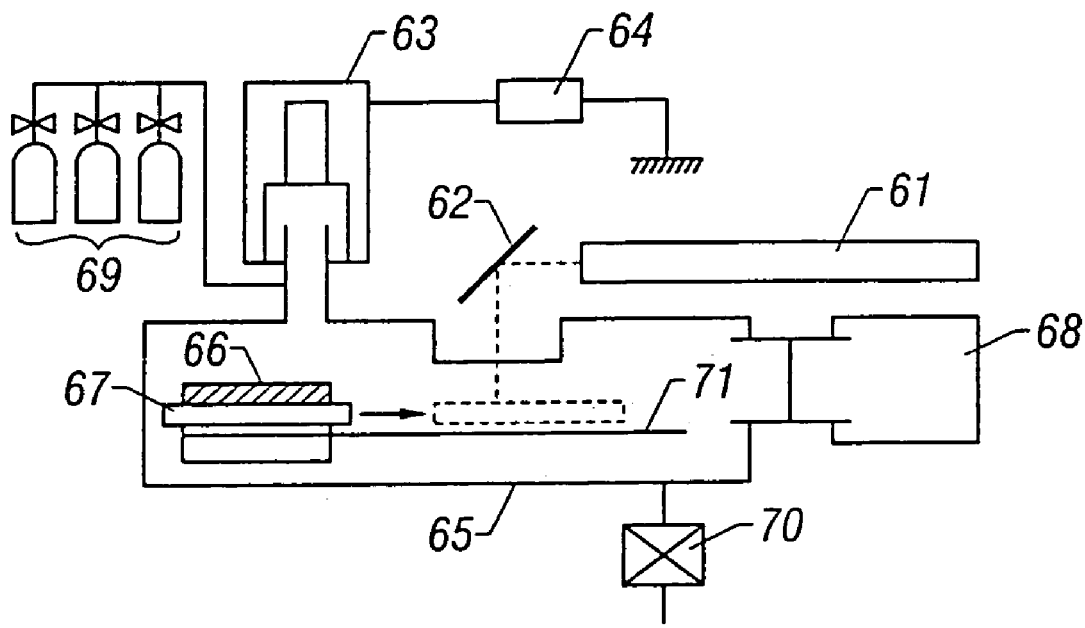
FIGS. 7(A) and 7(B) schematically illustrate a configuration of an ion doping apparatus according to a fourth embodiment of the present invention.
Figure 7B:
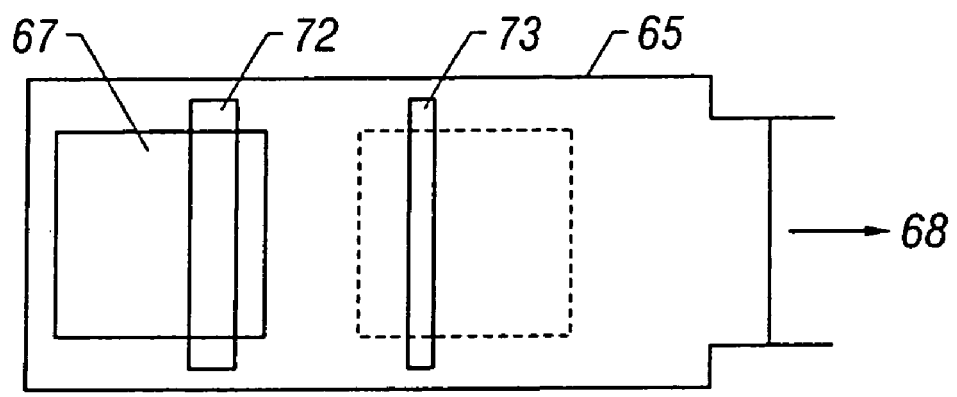

The present embodiment will be described with reference to FIGS. 7(A) and 7(B). FIG. 7(A) is a conceptual illustration of a section of an apparatus according to the present embodiment, and FIG. 7(B) is a conceptual illustration of the apparatus of the present embodiment as viewed from above (in the direction in which an ion current is introduced or in the direction in which a laser beam is introduced).

The ion doping and laser annealing apparatus of the present embodiment comprises an ion source/accelerator 63, a doping chamber 65, a power supply device 64, a gas box 69, and an exhaust device 70 like the ion doping apparatuses of other embodiments. In addition to them, however, there is provided a laser device 61 and an optical system 62. Further, there is provided a spare chamber 68. Needless to say, a window 73 is provided at the doping chamber 65 for introducing a laser beam therein. The window 73 for introducing a laser beam is provided in parallel with a window 72 for introducing an ion current.

A substrate 66 is held by a substrate holder 67 which is moved in the doping chamber 65 in at least one direction by a transport mechanism 71. A heater or the like may be provided on the substrate holder 67. The longitudinal direction of the ion current is a direction perpendicular to the plane of the drawing.

Firth Embodiment

A fifth embodiment of the present invention will now be described. A device having an ion forming means and a device having an ion accelerating means used in the present embodiment have configurations of those of the devices shown in FIG. 4.

Figure 8:
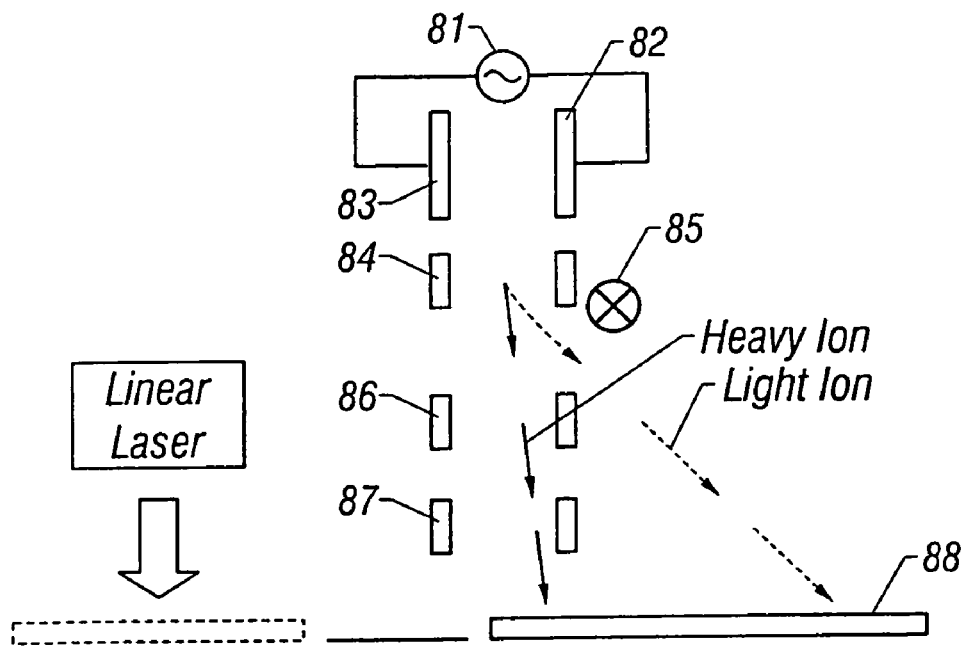
FIG. 8 schematically illustrates an ion source/accelerator of ion doping apparatuses according to fifth and sixth embodiments of the present invention.

FIG. 8 is a conceptual illustration of an ion doping apparatus used in the present embodiment. A dopant gas is ionized by plasma generation electrodes 82 and 83 to which radio-frequency power is applied by a radio-frequency power supply 81. The resultant ions are extracted by an extraction electrode 84.

The doping apparatus of the present embodiment further includes a means 85 for applying a magnetic field to an ion beam. As a result, light ions (ions mainly composed of hydrogen) are deflected significantly. On the other hand, heavy ions (ions including the dopant) are subjected to little deflection. In the apparatus of the present embodiment, a suppressor electrode 86 and an acceleration electrode 87 are provided in the path of the heavy ions to selectively accelerate and radiate such an ion beam to a substrate. However, since no acceleration electrode is provided in the path of the light ions, the light ions are radiated to a substrate 88 on a stage (not shown) at the energy available when accelerated by the extraction electrode 84.

In the present embodiment, the ion beam is radiated to the substrate 88 in the form of a curtain like a waterfall. Doping is carried out with the substrate 88 scanned such that the dopant is evenly delivered to the entire substrate. The dose is controlled by the scanning speed of the substrate and the value of the ionic current. The scanning direction at this time is substantially perpendicular to the plane of the curtain formed by the dopant.

The waterfall of ions formed by the present apparatus has a width of 2 meters. This apparatus is used for the purpose of adding phosphorus or boron to a semiconductor material as dopant. The above-described ions include a great amount of $H_2+$ ions in addition to $PH_y+$ and $B_2H_x+$ ions. In the present embodiment, a $PH_3$ or $B_2H_6$ gas for semiconductors was used after diluting it with hydrogen to a density of about 5%.

By forming a magnetic field in a direction which is perpendicular to this ion current and which includes the plane of the ion curtain, a force is applied to the ion current in a direction perpendicular thereto. This force is referred to as "Lorentz force". It will be apparent from the equation of motion $Ma=qvB$ that the acceleration of ions a caused by the above-described magnetic field B is inversely proportionate to ion mass M and proportionate to ion charge q. The velocity component v of the ions after the incidence of the same upon the magnetic field depends on the ion mass M.

Since most of the ions accelerated have electrical charge at a value of 1 in the present embodiment, one can assume that the above-described acceleration depends only on the ion mass. The molecular weight of the $H_2+$ ions, $PH_y+$ ions, and $B_2H_x+$ ions included in the gas used in the present embodiment is about 2, 34, and 24 to 26, respectively. When the dependence of the above-described velocity component v on the mass is taken into consideration, it will be understood that the $H_2+$ ions are subjected to acceleration 10 to 100 times that for the ions including the dopant in the direction perpendicular to the ion current. Thus, the ion current may be separated on a mass basis by applying a magnetic field to the ion current.

Only the flow of the $H_2+$ ions could be appropriately changed without causing substantially no change in the direction of the ion current including the dopant by setting the extraction voltage at about 1 to 10 kV and applying a magnetic field of about 0.1 to 10 tesla, preferably 0.5 to 2 tesla in the direction shown in FIG. 8.

The magnetic field is formed immediately beyond the extraction electrode. This is because ions can be significantly deflected by deflecting the ions while the kinetic energy of the ions is still small. $H_2+$ ions deflected immediately beyond the extraction electrode reach the substrate 88 on the stage without passing through the suppressor electrode 86 and the acceleration electrode 87. This allows the speed of the $H_2+$ ions to be suppressed when they enter the substrate.

The angle of incidence of the $H_2+$ ions was about 50° when they reached the substrate. This angle was sufficient to allow the ions to enter the substrate. Meanwhile, the ion current including the dopant passed through the suppressor electrode and acceleration electrode and then was radiated to the substrate without being substantially affected by the above-described magnetic field. The angle of incidence was substantially 90°.

The above-described method of accelerating ions has made it possible to implant dopant to a desired depth while suppressing the speed of $H_2+$ ions as much as possible. In an equifield, the degree of acceleration of ions increased with a decrease in weight and an increase in electrical charge. Therefore, unless mass separation is performed on an ion current, lighter ions are implanted at higher speeds. That is, the lighter an ion, the deeper it is implanted in a substrate.

However, according to the present embodiment, the method of the present embodiment has made it possible to make the speed of the $H_2+$ ions which are light ions at the time of incidence upon the substrate substantially equal to or lower than the speed of the ions including dopant which are heavy ions at the time of incidence upon the substrate.

Such speed control makes it possible to cause the distribution of the $H_2+$ ions and the ions including the dopant in the direction of the depth of the substrate to resemble each other. This has made it possible to apply heat generated as a result of the release of the kinetic energy of the $H_2+$ ions directly to the dopant. This heat was used to recover lattice defects formed as a result of the implantation of the ions including the dopant and to activate the dopant. Further, this heat and a great amount of hydrogen were used to terminate uncombined arms of a lattice.

Generally speaking, some corrective action must be taken on damage caused by doping because it significantly deteriorates the characteristics of a semiconductor material. Such damage has been recovered by means of annealing means such as applying heat and irradiating it with light. Alternatively, there has been an effective means which adds hydrogen to a portion having such damage and to combine the hydrogen to lattice defects by means of annealing for the purpose of terminating the areas having the lattice defects.

Figure 10A:
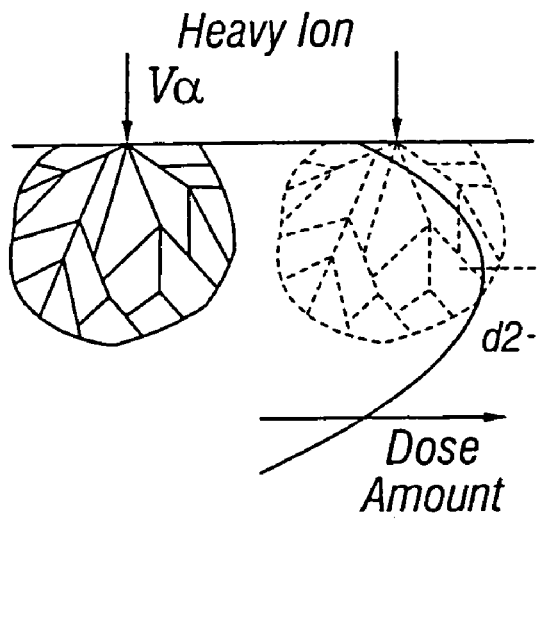
Figure 10A:
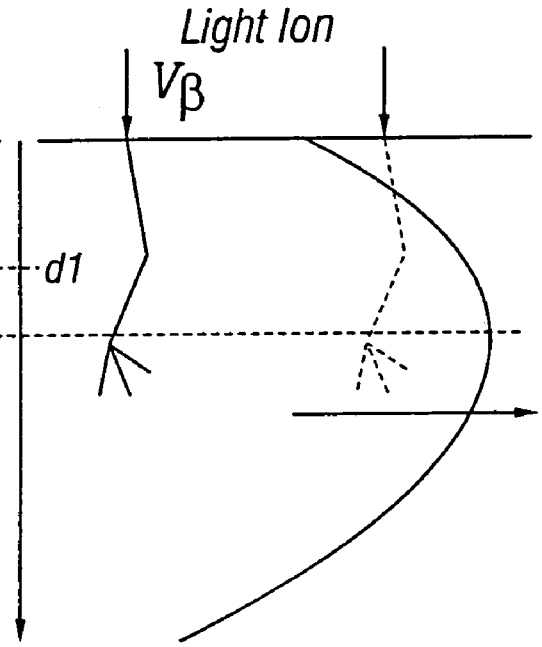

Meanwhile, when all ions are caused to enter perpendicularly without performing separation on a mass basis as described above, the speed of incidence $V\alpha$ of heavy ions and the speed of incidence $V\beta$ of light ions satisfies a relationship $V\alpha \ll V\beta$. Therefore, hydrogen ions which are relatively light are distributed deeper in a semiconductor film (FIG. 10(B)), and relatively heavy ions are distributed in a relatively shallow region of the film (FIG. 10(A)).

Thus, a center depth $d_2$ of the former and a center depth $d_1$ of the latter satisfies $d_1 \ll d_2$. This results in a deviation between the distribution of the hydrogen ions and the distribution of lattice defects caused by the dopant, which disallows the hydrogen ions to be used for the recovery of the defects effectively.

Figure 10C:
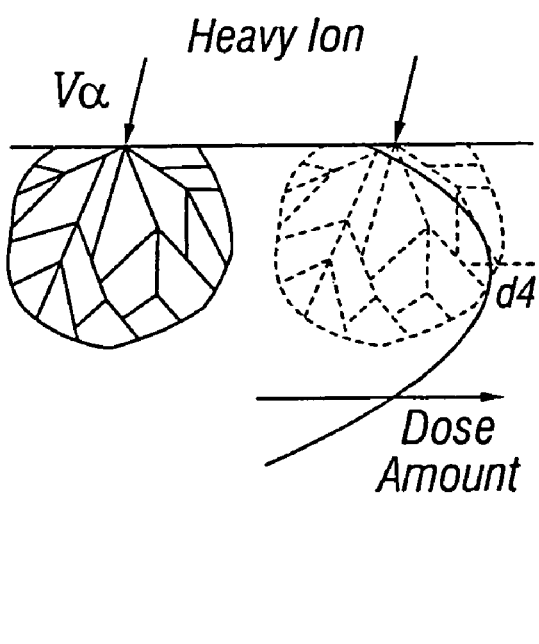
Figure 10D:
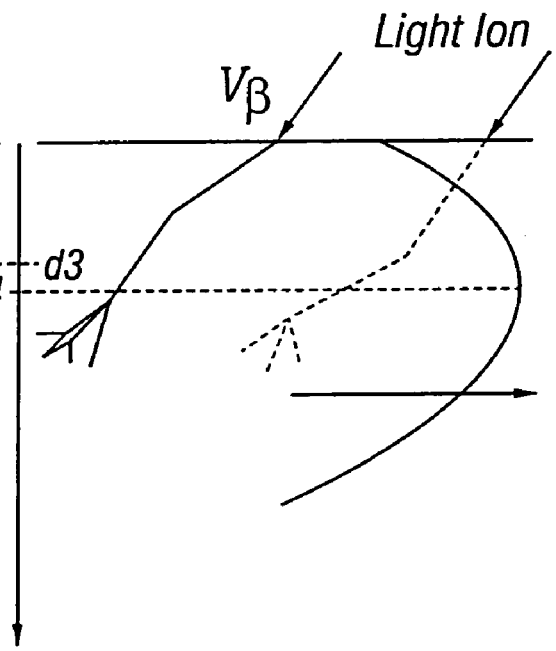

Meanwhile, when separation of ions on a mass basis was performed and the speeds of incidence of the ions are made substantially equal using the method shown in the present embodiment, the depth of penetration of the hydrogen ions (FIG. 10(D)) and the distribution of the dopant (FIG. 10(C)) were made close or equal to each other to improve the recovery of damage as described above significantly. Such an effect of recovery includes the effect of terminating lattice defects provided by the hydrogen ions and a thermal annealing effect as a result of the loss of energy of the hydrogen ions and the ions including the dopant in the film.

This effect was on the same level of the process (as previously described) which had been conventionally performed after doping. Although this effect became more significant with an increase in the density of the hydrogen ions in plasma, the appropriate density of the hydrogen ions in plasma was 50 to 90% taking throughput into consideration.

In scanning a substrate while irradiating it with ions, according to the present embodiment, the scanning direction of the substrate was determined such that $H_2+$ ions would be first implanted in the substrate and then ions including dopant such as $PH_y+$ or $B_2H_x+$ ions would be implanted. Since $H_2+$ ions are smaller and lighter than primary atoms that constitute a semiconductor film, they are implanted into a substrate without damaging lattices in the semiconductor material significantly, and the kinetic energy that such $H_2+$ ions lose results in an increase in the temperature of the substrate. Thereafter, heavy ions including dopant are implanted. The increased substrate temperature and the hydrogen are used to recover lattice defects produced at this time and to activate the dopant. Thus, annealing and hydrogenation can be performed simultaneously with doping.

Sixth Embodiment

A sixth embodiment of the present invention will now be described. The present embodiment employed completely the same apparatus as that in the fifth embodiment, the only difference being the direction in which a substrate was scanned. Specifically, when the substrate was scanned while irradiating it with ions, the substrate was scanned such that ions including dopant such as $PH_y+$ or $B_2H_x+$ were first implanted into the substrate and then $H_2+$ ions were implanted.

Since the heavy ions including dopant are substantially as heavy as primary atoms that constitute semiconductor film, they have influence on lattices in the semiconductor material which can significantly deteriorate the characteristics of the semiconductor. Thereafter, the $H_2+$ ions are implanted, and the kinetic energy that the $H_2+$ ions lose results in an increase in the temperature of the substrate. This temperature and the supply of hydrogen have a function of recovering lattice defects and activating the dopant.

The present embodiment had substantially the same level of effectiveness as the fifth embodiment in recovering lattice defects and activating dopant. The present embodiment indicates that the order of the implantation of hydrogen ions and ions including dopant into a substrate does not have any influence on the effects of the present invention.

Seventh Embodiment

Figure 9:
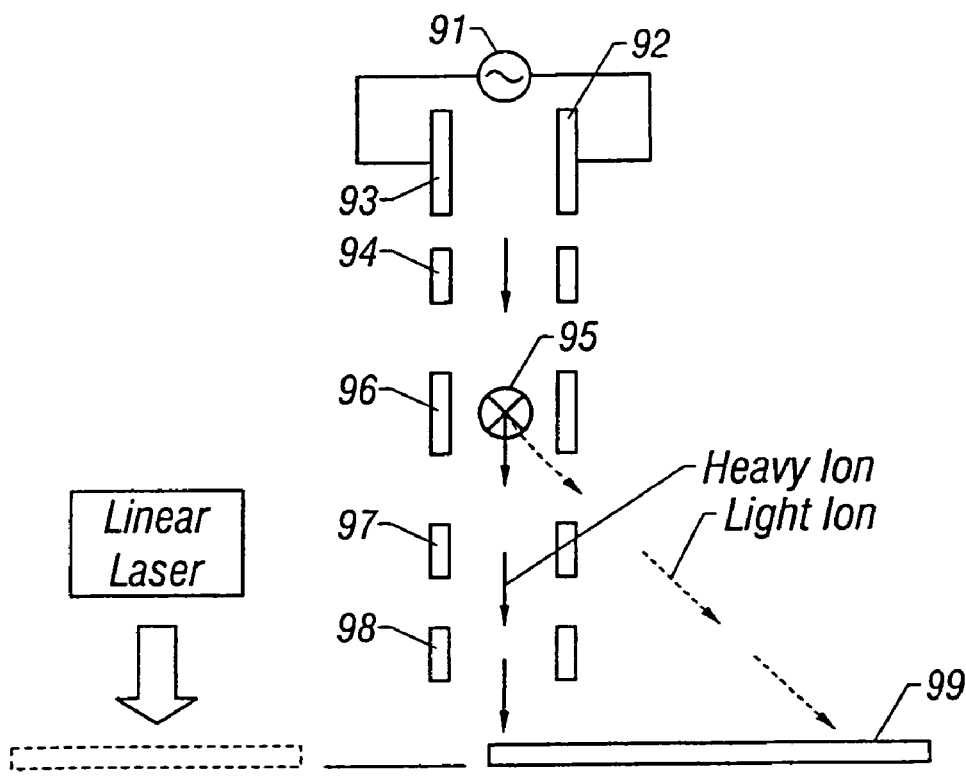
FIG. 9 schematically illustrates an ion source/accelerator of ion doping apparatus according to a seventh embodiment of the present invention.

A seventh embodiment of the present invention will now be described. FIG. 9 is a conceptual illustration of an ion doping apparatus used in the present embodiment which is different from the doping apparatuses described in the fifth and sixth embodiments in that it includes a means for further applying an electrical field to a region of an ion current which is in a magnetic field. This means also allows mass separation to be performed on the ion current as the apparatuses in the first and second embodiments. The difference is that it can perform mass separation ideally without deflecting the flow of ions including dopant at all. This mass separator is referred to as "E×B separator".

A dopant gas is ionized by plasma generation electrodes 92 and 93 to which radio-frequency power is applied by a radio-frequency power supply 91. The resultant ions are extracted by an extraction electrode 94.

The ions are further subjected to separation on a mass basis performed by a means 95 for applying a magnetic field to an ion beam and a means 96 and, as a result, light ions (ions mainly composed of hydrogen) are deflected significantly. In the apparatus of the present embodiment, a suppressor electrode 97 and an acceleration electrode 98 are provided in the path of the heavy ions to selectively accelerate and radiate such an ion beam to a substrate. However, since no acceleration electrode is provided in the path of the light ions, the light ions are radiated to a substrate 99 on a stage (not shown) at the energy available when accelerated by the extraction electrode 94.

In the present embodiment, the ion beam is radiated to the substrate 99 again in the form of a curtain like a waterfall. Doping is carried out with the substrate scanned such that the dopant is evenly delivered to the entire substrate. The dose is controlled by the scanning speed of the substrate and the value of the ionic current. The scanning direction at this time is substantially perpendicular to the plane of the curtain formed by the dopant.

The waterfall of ions formed by the present apparatus has a width of 2 meters. This apparatus is used for the purpose of adding phosphorus or boron to a semiconductor material as dopant. The above-described ions include a great amount of $H_2+$ ions in addition to $PH_y+$ and $B2H_x+$ ions. In the present embodiment, a $PH_3$ or $B_2H_6$ gas for semiconductors was used after diluting it with hydrogen to a density of about 5%.

By forming a magnetic field in a direction which is perpendicular to this ion current and which includes the plane of the ion curtain, a force is applied to the ion current in a direction perpendicular thereto. This force is referred to as "Lorentz force". A lateral force F applied to the ion current can be obtained by the equation of motion F=qvB− qE. F may be set at 0 in order not to deflect the ion current.

Since a velocity component v of the ions immediately after the incidence of the same upon the magnetic field in the direction of the ion current before the incidence upon the magnetic field depends on ion mass M, the velocity v of the ions including dopant may be substituted in the above-described equation of motion, and the magnetic field B and the electrical field E may be adjusted to set the force F equal to 0. At this time, since the hydrogen ions has a velocity different from the velocity v of the ions including dopant, they are subjected to a force F which is not 0. It will be now apparent that the present apparatus can perform separation on a mass basis.

The flow of the $H_2+$ ions could be appropriately changed by setting the extraction voltage at about 1 to 10 kV and applying a magnetic field of about 0.1 to 10 tesla, preferably 0.5 to 2 tesla in the direction shown in FIG. 9.

The magnetic field is formed immediately beyond the extraction electrode 94. This is because ions can be significantly deflected by deflecting the ions while the kinetic energy of the ions is still small. $H_2+$ ions deflected immediately beyond the extraction electrode reach the substrate on the stage without passing through the suppressor electrode 97 and the acceleration electrode 98. This allows the speed of the $H_2+$ ions to be suppressed when they enter the substrate.

The angle of incidence of the $H_2+$ ions was about 45° when they reached the substrate. This angle was sufficient to allow the ions to enter the substrate. Meanwhile, the ion current including the dopant passed through the suppressor electrode 97 and acceleration electrode 98 and then was radiated to the substrate without being substantially affected by the above-described E×B separator.

The above-described method of accelerating ions provided the same effect as that described in the fifth and sixth embodiments. The present embodiment is more advantageous than the fifth and sixth embodiments in that the extraction electrode 94, the suppressor electrode 97, and the acceleration electrode 98 can be made small because the ions including the dopant reach the substrate substantially straightly. However, the fifth and sixth embodiments are better from the viewpoint of design and maintenance because the E×B separator is somewhat complicated in structure. The present embodiment was advantageous in that it did not depend on the scanning direction of a substrate as in the fifth and sixth embodiments.

The present invention provides an ion doping apparatus capable of processing a large area. Further, the present invention makes it possible to eliminate the need for annealing and hydrogenation steps, to reduce the processing time of such steps, or to decrease the processing temperature. The advantages provided by the present invention as described above. Thus, the present invention is advantageous from an industrial point of view.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

The invention claimed is:

1. An ion doping apparatus comprising:
    a pair of plasma generation electrodes for generating a plasma therebetween, wherein the pair of plasma generation electrodes are elongated in one direction;
    an extraction electrode for extracting ions in the plasma;
    an acceleration electrode for accelerating a flow of the ions; and
    coils located between the extraction electrode and the acceleration electrode.

2. An ion doping apparatus according to claim 1, wherein the coils focus the ions.

3. An ion doping apparatus according to claim 1, wherein a width of the pair of plasma generation electrodes is from 1 to 10 cm.

4. An ion doping apparatus according to claim 1, wherein a length of the pair of plasma generating electrodes is from 50 to 150 cm.

5. An ion doping apparatus comprising:
    a pair of plasma generation electrodes for generating a plasma therebetween, wherein the pair of plasma generation electrodes are elongated in one direction;
    an extraction electrode for extracting ions in the plasma;
    an acceleration electrode for accelerating a flow of the ions;
    coils located between the extraction electrode and the acceleration electrode; and
    a means for applying a magnetic field to the ions.

6. An ion doping apparatus according to claim 5, wherein the coils focus the ions.

7. An ion doping apparatus according to claim 5, wherein a magnitude of the magnetic field is from 0.1 to 10 tesla.

8. An ion doping apparatus according to claim 5, the ions are separated on a mass basis by the means for applying the magnetic field.

9. An ion doping apparatus according to claim 5, wherein the means for applying the magnetic field is located under the acceleration electrode.

10. An ion doping apparatus according to claim 5, wherein a width of the pair of plasma generation electrodes is from 1 to 10 cm.

11. An ion doping apparatus according to claim 5, wherein a length of the pair of plasma generating electrodes is from 50 to 150 cm.

12. An ion doping apparatus comprising:
    a pair of plasma generation electrodes for generating a plasma therebetween, wherein the pair of plasma generation electrodes are elongated in one direction;
    an extraction electrode for extracting ions in the plasma;
    an acceleration electrode for accelerating a flow of the ions; and
    coils located between the extraction electrode and the acceleration electrode,
    wherein each of the extraction electrode and the acceleration electrode has a cavity through which the ions flow.

13. An ion doping apparatus according to claim 12, wherein the coils focus the ions.

14. An ion doping apparatus according to claim 12, wherein a width of the pair of plasma generation electrodes is from 1 to 10 cm.

15. An ion doping apparatus according to claim 12, wherein a length of the pair of plasma generating electrodes is from 50 to 150 cm.

16. An ion doping apparatus comprising:
    a pair of plasma generation electrodes for generating a plasma therebetween, wherein the pair of plasma generation electrodes are elongated in one direction;
    an extraction electrode for extracting ions in the plasma;
    an acceleration electrode for accelerating a flow of the ions;
    coils located between the extraction electrode and the acceleration electrode; and
    a means for applying a magnetic field to the ions,
    wherein each of the extraction electrode and the acceleration electrode has a cavity through which the ions flow.

17. An ion doping apparatus according to claim 16, wherein the coils focus the ions.

18. An ion doping apparatus according to claim 16, wherein a magnitude of the magnetic field is from 0.1 to 10 tesla.

19. An ion doping apparatus according to claim 16, the ions are separated on a mass basis by the means for applying the magnetic field.

20. An ion doping apparatus according to any one of claims 19, wherein the means for applying the magnetic field is located under the acceleration electrode.

21. An ion doping apparatus according to any one of claims 16, wherein the means for applying the magnetic field is located under the acceleration electrode.

22. An ion doping apparatus according to claim 16, wherein a width of the pair of plasma generation electrodes is from 1 to 10 cm.

23. An ion doping apparatus according to claim 16, wherein a length of the pair of plasma generating electrodes is from 50 to 150 cm.

* * * * *